United States Patent
Trotta et al.

(10) Patent No.: US 8,478,219 B2
(45) Date of Patent: Jul. 2, 2013

(54) HETERODYNE RECEIVER

(75) Inventors: Saverio Trotta, Munich (DE); Ralf Reuter, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 235 days.

(21) Appl. No.: 13/055,474

(22) PCT Filed: Jul. 25, 2008

(86) PCT No.: PCT/IB2008/053000
§ 371 (c)(1),
(2), (4) Date: Jan. 24, 2011

(87) PCT Pub. No.: WO2010/010425
PCT Pub. Date: Jan. 28, 2010

(65) Prior Publication Data
US 2011/0124309 A1    May 26, 2011

(51) Int. Cl.
*H04B 1/18* (2006.01)
(52) U.S. Cl.
USPC ..... 455/190.1; 455/130; 455/131; 455/189.1; 455/207; 327/355; 327/356; 327/359; 327/113
(58) Field of Classification Search
USPC .......... 455/130, 131, 189.1, 190.1, 207, 455/208, 209, 313, 314, 315, 323, 326; 327/355, 327/356, 359, 113
See application file for complete search history.

(56) References Cited

U.S. PATENT DOCUMENTS

| 6,026,286 A | 2/2000 | Long |
| 2004/0043741 A1 * | 3/2004 | Goddard et al. ............... 455/313 |

(Continued)

FOREIGN PATENT DOCUMENTS

| JP | 2005072885 A | 3/2005 |
| WO | 98/43400 A | 10/1998 |
| WO | 2009/104055 A1 | 8/2009 |

OTHER PUBLICATIONS

Bosen Tzeng et al: "A 1-17-GHz InGaP-GaAs HBT MMIC Analog Multiplier and Mixer With Broad-BandInput-Matching Networks" IEEE Transactions on Microwave Theory and Techniques, IEEE Service Center, Piscataway, NJ, US, vol. 50, No. 11, Nov. 1, 2002.

(Continued)

*Primary Examiner* — Tuan Pham

(57) ABSTRACT

A down-conversion module for a heterodyne receiver comprises a first mixer circuit, a second mixer circuit and an interconnection. The first mixer circuit includes first and second differential control terminals and is arranged to produce a first down-converted differential voltage signal at a first down-converted frequency as a function of a first RF differential input signal applied to the first differential control terminals and of a first RF differential reference frequency signal applied to the second differential control terminals. The second mixer circuit includes two differential pairs of second amplifier elements and the second amplifier elements comprise second differential control terminals and cross-connected pairs of second amplifier output paths for producing a second down-converted differential voltage signal at a second down-converted frequency as a function of the first down-converted differential voltage signal and of a second RF differential reference frequency signal applied to the second differential control terminals. The interconnection includes transmission line elements and is arranged to apply a differential current signal which is a function of the first down-converted differential voltage signal to differential input terminals of the second mixer circuit common to respective pairs of the second amplifier elements.

10 Claims, 5 Drawing Sheets

U.S. PATENT DOCUMENTS

| | | | |
|---|---|---|---|
| 2004/0259519 A1* | 12/2004 | Su | 455/326 |
| 2005/0118979 A1 | 6/2005 | Langenberg et al. | |
| 2005/0195336 A1 | 9/2005 | Waight et al. | |
| 2008/0132195 A1 | 6/2008 | Maxim et al. | |
| 2010/0261446 A1* | 10/2010 | McMullin et al. | 455/226.1 |

OTHER PUBLICATIONS

Parsa Ali et al: "A 60GHz CMOS Receiver Using a 30GHz LO" IEEE, International Solid-State Circuits Conference, Session 9, mm-Wave & Phased Arrays, 9.6, San Francisco, CA, Feb. 3-7, 2008, pp. 190-606.

Muller A et al: "A 122 GHz SiGe Active Subharmonic Mixer" Gallium Arsenide and Other Semiconductor Application Symposium, 2005. EGAAS 2005. European, IEEE, Oct. 3-4, 2005, pp. 57-60.

Trotta Saverio et al: "Design Considerations for Low-Noise, Highly-Linear Millimeter-Wave Mixers in SiGe Bipolar Technology" IEEE, 2007, pp. 356-359.

Gilbert Barrie et al: "Fundamentals of Active Mixers" Applied Microwave & Wireless, IEEE ISSCC Short Course, Feb. 2000, Winter 1995, pp. 1-7.

Upadhyaya Parag et al: "A 5.6 GHz Doubly Balanced Sub-Harmonic Mixer for Direct Conversion—Zero IF Receiver" IEEE, 2004, pp. 129-130.

International Search Report and Written Opinion correlating to PCT/IB2008/053000 dated May 27, 2009.

Rose, S. "A CMOS Sub-harmonic Mixer for WCDMA," Master of Science, Plan II, Electrical Engineering and Computer Science Department of University of California at Berkeley, Berkeley, California, USA; Jan. 2002, pp. 1-54.

Hartmann, M. et al. "A Low-Power Low-Noise Single-Chip Receiver Front-End for Automotive Radar at 77GHz in Silicon-Germanium Bipolar Technology," IEEE RFIC Symposium 2007, Honolulu, Hawaii, USA; Jun. 3-5, 2007, pp. 149-152.

Dehlink, B. et al. "A Highly Linear SiGe Double-Balanced Mixer for 77GHz Automotive Radar Applications," RFIC Symposium 2006 IEEE, San Francisco, California, USA; Jun. 11-13, 2006, pp. 1-4.

Nicolson, S.T. et al. "A Low-Voltage 77-GHz Automotive Radar Chipset," IEEE/MTT-S International Microwave Symposium 2007, Honolulu, Hawaii, USA; Jun. 3-8, 2007, pp. 487-490.

\* cited by examiner

HETERODYNE RECEIVER

FIELD OF THE INVENTION

This invention relates to a down-conversion module for a heterodyne receiver and to a heterodyne receiver including such a down-conversion module.

BACKGROUND OF THE INVENTION

Down conversion mixers employed in the receive path generally have two inputs, the RF signal to be down converted and a waveform at a selected reference frequency generated by a local oscillator ('LO'), these signals being applied to an RF port and an LO port of the mixer respectively.

The performance parameters of typical down conversion mixers are compromises between parameters such as the noise figure, the linearity, the conversion gain, the input impedance, the 3rd order intercept point and the port-to-port isolation. In homodyne receivers, the fundamental frequency of the RF signal is close to the LO frequency, so that the RF signal is converted down to baseband in a single mixer stage. Homodyne receivers are susceptible to leakage of local oscillator ('LO') signals to the RF input port. In order to improve isolation between the RF-port and LO-port, a heterodyne receiver architecture can be used, such as a dual intermediate frequency ('IF') receiver in which the input RF signal is converted down to baseband in two mixer circuits.

An example of a known down-conversion module for a dual-IF receiver, using two cascaded mixers based on Gilbert cell architecture, is described in the digest of the paper presented by B. Razavi et al. at the IEEE International Solid State Circuits Conference on Feb. 5, 2008: "A 60 GHz CMOS Receiver Using a 30 GHz LO", Digest. In this configuration, a single LO signal is used, with separate down-conversion modules for I- and Q-paths.

Another example of a known down-conversion module, using sub-harmonic mixers, is described in the paper by A. Mueller et al.: "A 122 GHz SiGe Active Subharmonic Mixer", IEEE 13th GAAS Symposium, Paris 2005. However, this configuration requires two LO signals at 90° phase difference.

SUMMARY OF THE INVENTION

The present invention provides a heterodyne down-conversion module and a heterodyne receiver as described in the accompanying claims.

These and other aspects of the invention will be apparent from and elucidated with reference to the embodiments described hereinafter.

Specific embodiments of the invention are set forth in the dependent claims.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

The present invention is particularly, but not exclusively, applicable to dual-IF radio receivers for operating with received radio carrier frequencies in the millimetre-wavelength range, which correspond to frequencies greater than 10 GHz, and especially in the range from 50 to 100 GHz or more. The LO frequencies in a dual-IF receiver can be much lower, for example half, the LO frequency in a homodyne receiver and are more readily filtered out.

A heterodyne receiver includes more than one down-conversion mixer module, two in the case of a dual-IF receiver. In SiGe bipolar design the mixer modules have usually been implemented as Gilbert-cells. Other Gilbert cell mixers are known using field effect transistors, such as complementary metal-oxide field effect transistors, instead of bipolar transistors.

A Gilbert-cell includes an RF input pair of amplifier elements which converts an RF voltage input signal to a current signal followed by double cross-coupled differential pairs of amplifier elements, sometimes known as a switching quad. The linearity of a Gilbert-cell (when the clipping at the output can be neglected) is mainly related to the input pair. This means that, in the case of the dual-IF receiver (which includes two mixers), the linearity may be drastically reduced, since the input pair of each mixer will limit the linearity. The reduced linearity of a heterodyne receiver has been one of the main drawbacks of that topology.

Figure 1:
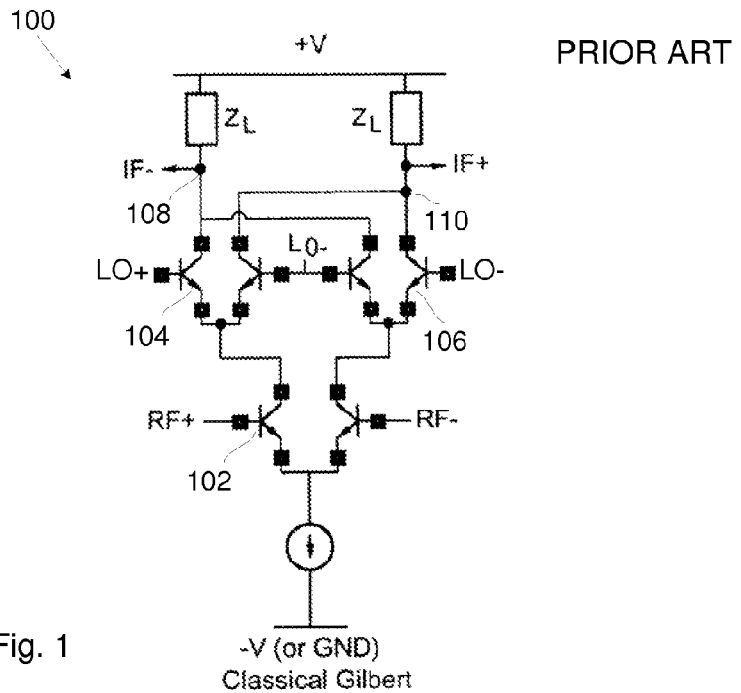
FIG. 1 is a schematic diagram of a known mixer circuit.

FIG. 1 shows the main elements of a known double-balanced Gilbert mixer 100, including an RF stage connected between voltage supply rails +V and −V and comprising a pair 102 of bipolar transistors, an LO stage comprising pairs of bipolar transistors 104 and 106 and respective output impedances $Z_L$. The RF stage 102 receives the RF input signal at a port comprising terminals RF+ and RF− and the LO stage 104, 106 receives an LO signal from a local oscillator at a port comprising terminals LO+ and LO−. The output IF-port comprises terminals IF+ and IF− connected to cross-connections 108 and 110 between the LO stage and respective output impedances $Z_L$ connected to the supply rail +V. The RF stage comprises a differential pair 102 of bipolar transistors with a current source connected to the supply rail −V and converts the voltage input signal to a current signal. The double differential pairs 104 and 106 of bipolar transistors of the LO stage are cross-coupled to steer the current from the RF stage pair 102 from one side to the other side of the differential pairs by commutating alternately all the tail current in the RF stage pair and the current source from one side to the other of the LO stage at the LO frequency and produces a mixed RF/LO current signal. The output impedances $Z_L$ convert the mixed current signal to a voltage signal.

In addition to the linearity issues of heterodyne receivers noted above, design of a Gilbert cell presents difficulties for achieving low noise. Notably, potential sources of noise include base current induced shot noise between the bases and collectors of the RF stage 102, collector shot noise between the collectors and emitters of the RF stage 102, collector shot noise between the collectors and emitters of the LO stage 104, 106, especially during switching, and thermal noise across resistive elements of the output impedances $Z_L$.

Figure 2:
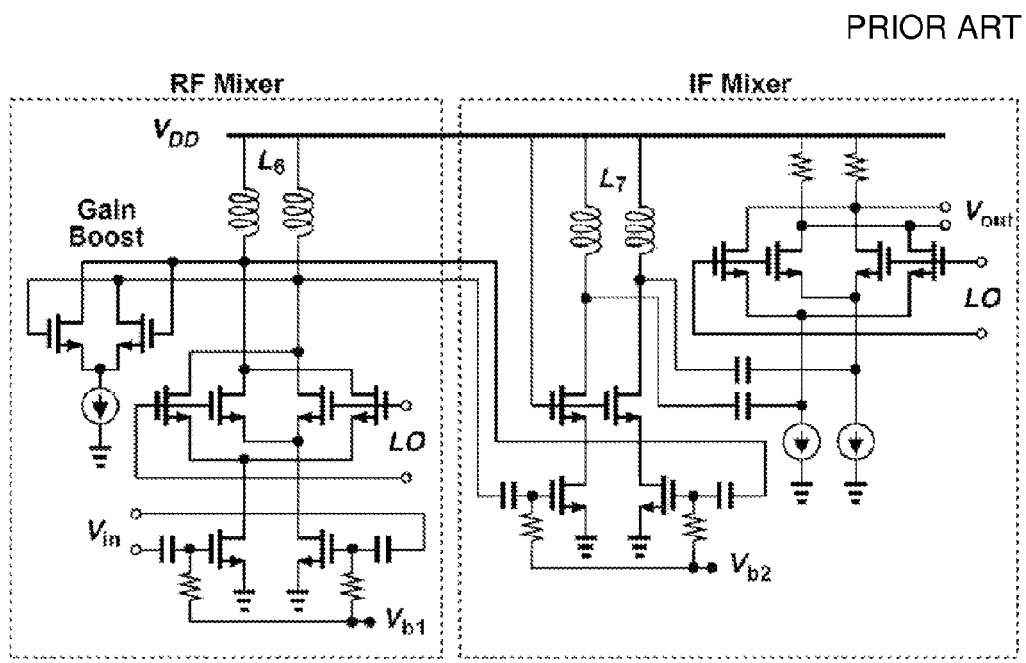
FIG. 2 is a schematic diagram of a known down-conversion module.

FIG. 2 shows the known down-conversion module for a dual-IF receiver, using two cascaded mixer modules, described in the digest of the paper presented by B. Razavi et al. at the IEEE International Solid State Circuits Conference on Feb. 5, 2008: "A 60 GHz CMOS Receiver Using a 30 GHz LO", Digest. Such a configuration has an advantage in that it uses the same LO frequency for both mixer modules, avoiding the need for a frequency doubler, which is required for other configurations where one LO frequency is ⅓ the input frequency and the other is ⅔. However, the two mixer modules both include RF stages, and the first mixer module has a low-current cross-coupled pair placed at the output of the RF mixer to raise the gain by 3 dB, which limits the compression point (a measure of linearity) to −27.5 dB. Noise performance is not optimized. These considerations are antagonistic, since the first mixer module needs high gain to reduce the overall signal-to-noise ratio, in accordance with Friis' formula, but this lowers the point at which it drives the second module into compression.

In the known down-conversion module in a dual-IF receiver, using sub-harmonic mixers, described in the paper by A. Mueller et al.: "A 122 GHz SiGe Active Sub-harmonic Mixer", IEEE 13th GAAS Symposium, Paris 2005, the two LO signals at 90° phase difference require more complex LO generation, using a polyphase filter or IQ generator, for example. Also, the use of two stacked switching quads reduces linearity due to the clipping action of the quads and higher supply voltage headroom is needed than with single switching quads. The use of active SiGe sub-harmonic mixers results in higher 1/f noise.

Figure 3:
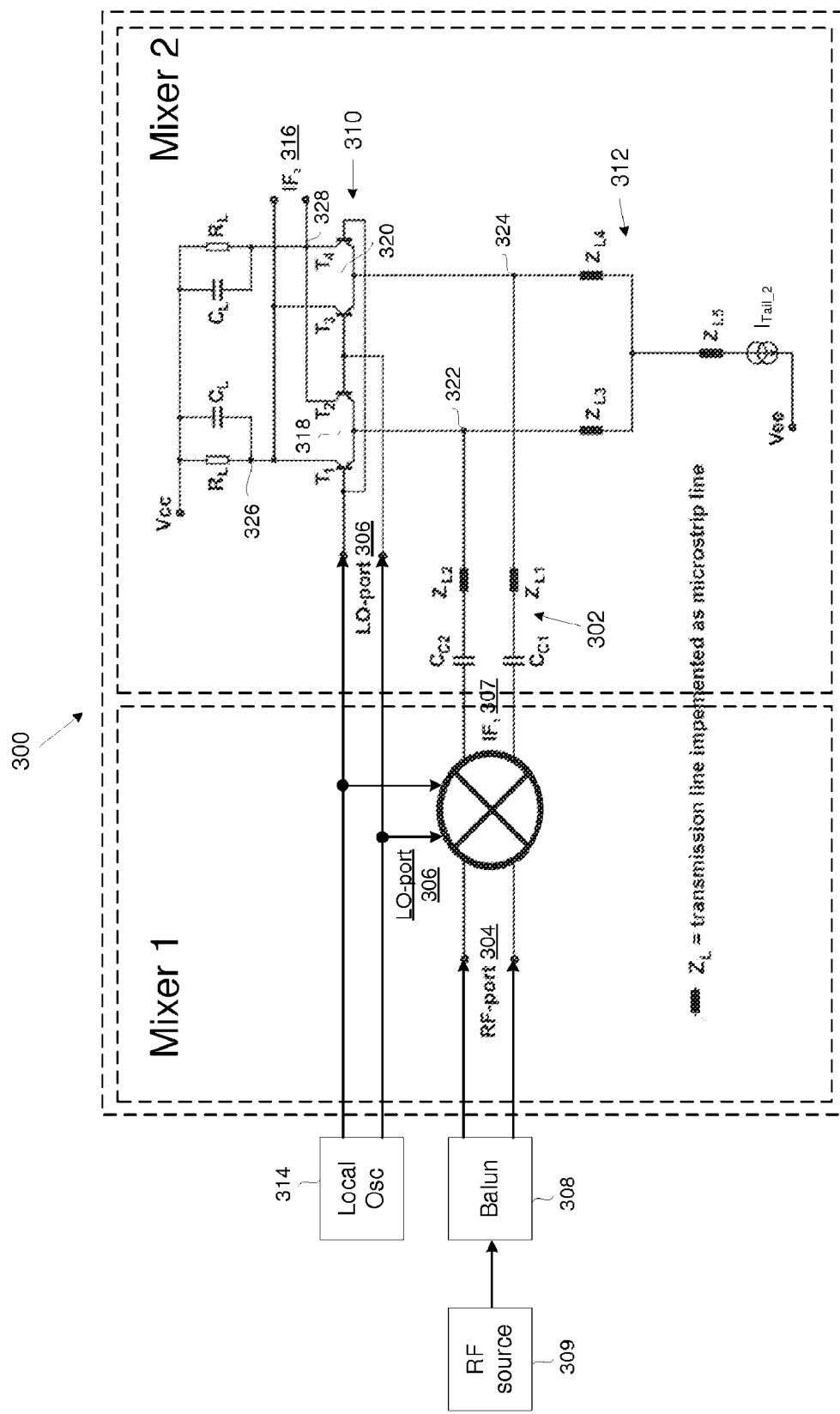
FIG. 3 is a schematic diagram of a receiver including a down-conversion module in accordance with an embodiment of the present invention, given by way of example.

FIG. 3 shows a down-conversion module 300 for a dual-IF heterodyne receiver in accordance with an embodiment of the present invention, given by way of example. The module 300 comprises a first mixer circuit Mixer 1, a second mixer circuit Mixer 2 and an interconnection 302 between the two mixer circuits comprising a differential pair of interconnection paths. The first mixer circuit Mixer 1 includes first differential (RF-port) terminals 304 and second differential (LO-port) terminals 306 and is arranged to produce a first down-converted differential voltage signal $IF_1$ at an IF port 307 at a first down-converted frequency $f_{IF1}$ as a function of a first RF differential input signal applied to the RF-port 304 and of a first RF differential reference frequency (LO) signal applied to the LO-port 306. In this embodiment of the invention, the first RF differential input signal $IF_1$ is provided directly by a balun 308 from a single-ended RF source 309 such as a receiver antenna, after channel selection, without any low-noise input amplifier.

The second mixer circuit includes two differential pairs (318, 320) of amplifier elements comprising second differential control terminals and cross-connected pairs of second amplifier output paths for producing a second down-converted differential voltage signal ($IF_2$) at a second down-converted frequency as a function of the first down-converted differential voltage signal ($IF_1$) and of a second RF differential reference frequency signal (LO) applied to the second differential control terminals. The interconnection (302) includes transmission line elements ($Z_{L1}$, $Z_{L2}$) and is arranged to apply a differential current signal which is a function of the first down-converted differential voltage signal ($IF_1$) to differential input terminals of the second mixer circuit common to respective pairs (318, 320) of the second amplifier elements.

In more detail, in this example of an embodiment of the invention, the second mixer circuit Mixer 2 comprises a switching quad 310 receiving as input the first down-converted differential voltage signal $IF_1$ from the first mixer circuit Mixer 1 through the interconnection 302 on a common tail 312. In this embodiment of the invention, a local oscillator module 314 produces the first and second RF differential reference signals (LO) at the same local oscillator frequency $f_{LO}$ for both the first and second mixer circuits Mixer1 and Mixer2 and the local oscillator frequency $f_{LO}$ is arranged to be substantially equal to half the frequency of the first RF differential input signal $f_{RF}$ at the RF-port 304, so that the second mixer circuit Mixer 2 produces down-converted differential output voltage signals at differential output port terminals 316 in baseband. In another embodiment of the invention, different LO frequencies are used for the first and second mixer circuits Mixer1 and Mixer2, the output voltage signals at the differential output port terminals 316 still being in baseband. In yet another embodiment of the invention, the heterodyne receiver includes more than two down-conversion modules, a first module similar to Mixer 2 being followed by a further similar down-conversion module, the local oscillator frequencies being chosen so that the differential output port terminals from the last down-conversion module are again in baseband.

The mixer circuit Mixer 2 comprises two differential pairs 318 and 320 of bipolar transistors $T_1$, $T_2$ and $T_3$, $T_4$ which form a switching quad 310. In each case, the transistors have bases forming control electrodes for emitter-collector amplifier paths, the bases of the LO stage transistors $T_1$ and $T_4$ being connected to one terminal of the LO port 306, and the bases of the LO stage transistors $T_2$ and $T_3$ being connected to the other terminal of the LO port 306. The common tail 312 comprises parallel transmission lines $Z_{L3}$ and $Z_{L4}$ from common emitter nodes 322 and 324 of the pairs 318 and 320 respectively, in series with a common transmission line $Z_{L5}$ and a constant current source $I_{Tail\_1}$, the common tail 312 providing DC connections for the switching quad 310 to the DC lower voltage supply rail Vee.

The first down-converted differential voltage signal $IF_1$ from the first mixer circuit Mixer 1 is applied to the common emitter nodes 322 and 324 of the switching quad 310 through the differential paths of the interconnection 302 including a capacitor $C_{C1}$ in series with a transmission line $Z_{L1}$, and a capacitor $C_{C2}$ in series with a transmission line $Z_{L2}$ respectively, the capacitors $C_{C1}$, and $C_{C2}$ blocking DC bias and the lengths of the transmission lines $Z_{L1}$ and $Z_{L2}$ being chosen as a function of the impedance of the common tail 312, of the parasitic capacitance of the current source $I_{Tail\_1}$ and of the input impedances at the nodes 322 and 324 of the transistor pairs 318 and 320, so as to convert the differential voltage signal to a differential current signal to the emitters in the amplifier paths of the transistors $T_1$ to $T_4$. In an implementation for use at an input RF frequency of 77 GHz and with an LO frequency of 38.5 GHz, by way of example, satisfactory values for the lengths of $Z_{L1}$ and $Z_{L2}$ were found to be 55 μm.

The transmission lines $Z_{L3}$ and $Z_{L4}$ are of length λ/4, where λ is the wavelength of the $IF_1$ signal involved, so that they present an inductive impedance to provide the DC lower voltage Vee to the switching quad 310 while presenting a high impedance to the $IF_1$ signal. The transmission line $ZL_5$ makes the circuit more stable and adjusts the impedance presented by Itail1. In the example of implementation given above, a satisfactory value for the length of $ZL_5$ was greater than 100 µm.

The DC connections for the switching quad 310 also comprise an RC circuit comprising a resistor $R_L$ and a capacitor $C_L$ connected in parallel between the positive supply rail Vcc and a node 326 common to the collectors of the transistors $T_1$ and $T_3$, in series with the amplifier paths of the transistors $T_1$ and $T_3$, and an RC circuit comprising a resistor $R_L$ and a capacitor $C_L$ connected between the positive supply rail Vcc and a node 328 common to the collectors of the transistors $T_2$ and $T_4$, in series with the amplifier paths of the transistors $T_2$ and $T_4$. The nodes 326 and 328 are connected to respective terminals of the output port 316.

Bias for the bases of the transistors $T_1$, $T_2$, $T_3$ and $T_4$, is not shown but is provided by a source of bias voltage connected to the bases of the transistors $T_1$ and $T_4$ and to the bases of the transistors $T_2$ and $T_3$ through respective transmission lines as in our co-pending international patent application PCT/IB2008/050579 filed 18 Feb. 2008.

In operation, the $IF_1$ signal applied by the first mixer circuit Mixer 1 at frequency $f_{IF1}$ to the emitters of the two LO differential pairs 318 and 320 of the switching quad 310 and the LO signal applied to the control terminals which are the bases of the transistors of the two LO differential pairs 318 and 320 at the LO frequency $f_{LO}$ produce a mixed signal at baseband frequency at the output port 316. Application of the $IF_1$ signal from Mixer 1 to the switching quad 310 of Mixer 2 as a differential current signal through the transmission line elements $Z_{L1}$ and $Z_{L2}$ without an RF stage, such as the RF stage 102 of the Gilbert cell of FIG. 1 or the corresponding RF stage of FIG. 2, provides substantially improved linearity of the receiver.

Figure 4:
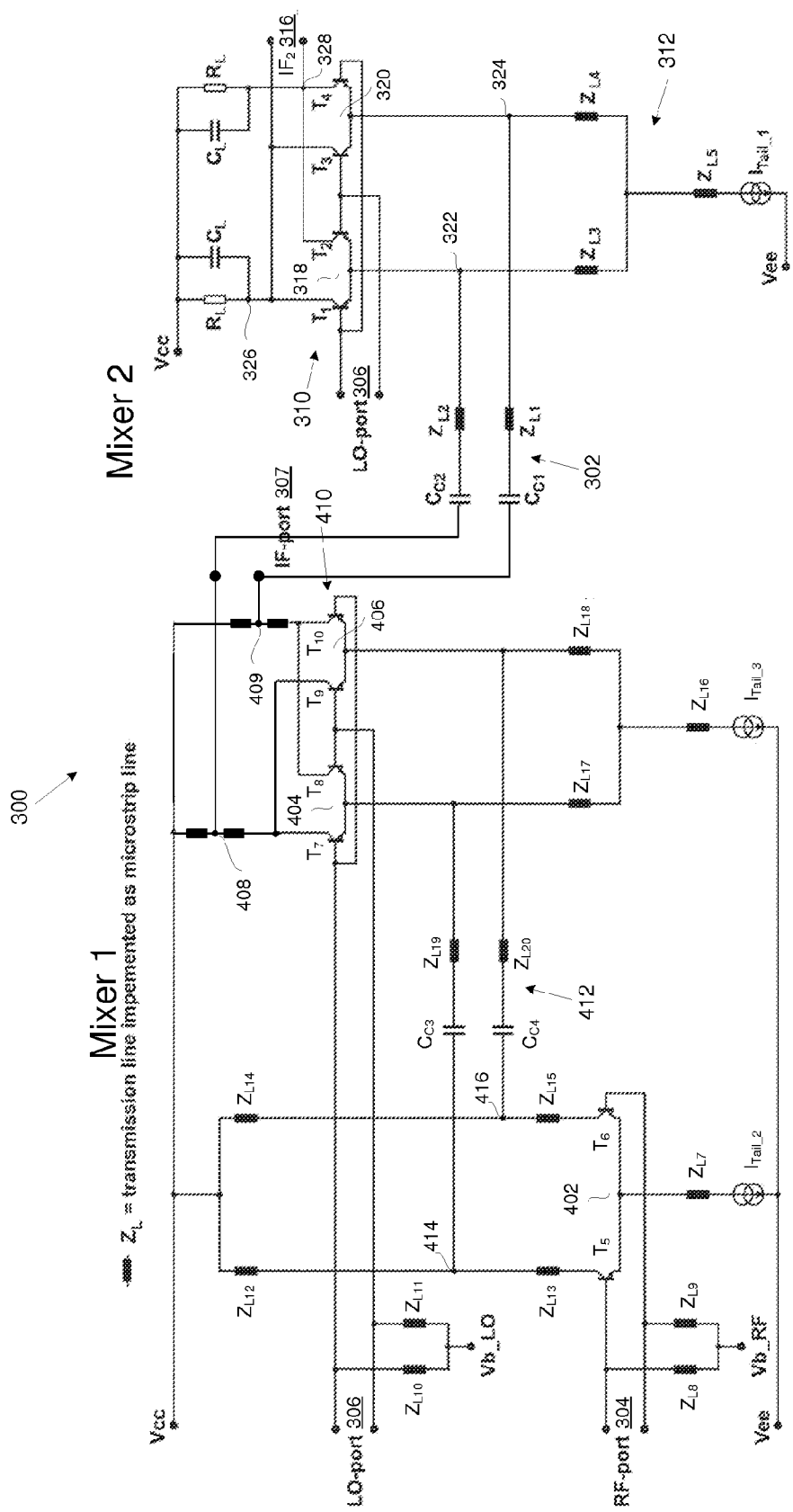
FIG. 4 is a more detailed schematic diagram of a down-conversion module in accordance with an embodiment of the present invention, given by way of example.

FIG. 4 shows a down-conversion module in accordance with an embodiment of the invention including a mixer circuit like the Mixer 2 stage of FIG. 3, and an example of a mixer circuit Mixer 1 shown in more detail. The mixer circuit stage Mixer 1 may have a structure similar to that of our co-pending international patent application PCT/IB2008/050579 filed 18 Feb. 2008.

The mixer circuit Mixer 1 of FIG. 4 includes an RF input stage comprising a differential pair 402 of bipolar transistors $T_5$ and $T_6$ and an LO switched pair stage 410 comprising two differential pairs 404 and 406 of bipolar transistors $T_7$, $T_8$ and $T_9$, $T_{10}$. In each case, the transistors have bases forming control electrodes for emitter-collector amplifier paths, the bases of the RF input stage transistors $T_5$ and $T_6$ being connected to the RF input port 304, the bases of the LO stage transistors $T_7$ and $T_{10}$ being connected to one terminal of the LO port 306, and the bases of the LO stage transistors $T_8$ and $T_9$ being connected to the other terminal of the LO port 306. Coupling elements provide parallel DC connections for the RF and LO stages respectively between the DC voltage supply rails Vcc and Vee.

The DC connections for the RF stage comprise a transmission line $Z_{L7}$ connected in common in the amplifier paths between the emitters of the transistors $T_5$ and $T_6$ and the supply rail Vee through a current source $I_{tail\_2}$ and transmission lines $Z_{L12}$ and $Z_{L13}$ connected in series in the amplifier path between the collector of the transistor $T_5$ and the supply rail Vcc and transmission lines $Z_{L14}$ and $Z_{L15}$ connected in series in the amplifier path between the collector of the transistor $T_6$ and the supply rail Vcc. The transmission lines present low impedance at low frequencies and in one implementation are formed by microstrip lines.

The DC connections for the LO stage comprise a transmission line $Z_{L17}$ connected in common in series with the amplifier paths of the transistors $T_7$ and $T_8$, a transmission line $Z_{L18}$ connected in common in series with the amplifier paths of the transistors $T_9$ and $T_{10}$ and a transmission line $Z_{L16}$ connecting the transmission lines $Z_{L17}$ and $Z_{L18}$ to the supply rail Vee through a constant current source $I_{Tail\_3}$. The DC connections for the LO stage also comprise a first voltage divider circuit comprising two transmission lines connected in series in the amplifier paths between the collectors of the transistors $T_7$ and $T_9$ and the supply rail Vcc with a node 408 between the two transmission lines and a second voltage divider circuit comprising two transmission lines connected in series in the amplifier paths between the collectors of the transistors $T_8$ and $T_{10}$ and the supply rail Vcc with a node 409 between the two transmission lines of the second divider circuit. The nodes 408 and 409 are connected to the IF port 307.

Bias for the bases of the transistors $T_5$ and $T_6$ is provided by a source of bias voltage Vb_RF connected to the bases through respective transmission lines $Z_{L8}$ and $Z_{L9}$. Bias for the bases of the transistors $T_7$, $T_8$, $T_9$ and $T_{10}$ is provided by a source of bias voltage Vb_LO connected to the bases of the transistors $T_7$ and $T_{10}$ and to the bases of the transistors $T_8$ and $T_9$ through respective transmission lines $Z_{L10}$ and $Z_{L11}$.

In operation, the RF signal applied by the amplifier paths of the RF differential amplifier 402 at the RF frequency to the emitters of the two LO differential pairs 404 and 406 and the LO signal applied to the control terminals which are the bases of the transistors of the two LO differential pairs 404 and 406 at the LO frequency produce a mixed signal at IF frequency $f_{IF1}$ at the IF port 307. The two LO differential pairs 404 and 406 of the Mixer 1 circuit are arranged to work at full swing, without clipping, as are the two differential pairs 318 and 320 of the Mixer 2 circuit.

The DC connections of the RF stage 402 and of the LO stage 404, 406 are independent of and parallel to each other. An RF interconnection 412 couples the RF stage 402 and the LO stage 404, 406 together and comprises the series connection of a DC isolating capacitor $C_{C3}$ and a transmission line $Z_{L19}$ and the series connection of a DC isolating capacitor $C_{C4}$ and a transmission line $Z_{L20}$. The DC isolating capacitor $C_{C3}$ and the transmission line $Z_{L19}$ connect the common emitters of the transistors $T_7$ and $T_8$ to a node 414 between the transmission lines $Z_{L12}$ and $Z_{L13}$. The DC isolating capacitor $C_{C4}$ and the transmission line $Z_{L20}$ connect the common emitters of the transistors $T_9$ and $T_{10}$ to a node 416 between the transmission lines $Z_{L13}$ and $Z_{L14}$.

The transmission lines present low impedance at low frequencies and in one implementation are formed by microstrip lines. The transmission line $Z_{L12}$ and $Z_{L14}$ in the respective RF amplifier paths are each of length approximately equivalent to $\lambda/4$, where $\lambda$ is the wavelength of the fundamental frequency of the RF signal. The lengths of the transmission lines $Z_{L13}$, $z_{L15}$, $Z_{L16}$, $Z_{L19}$ and $Z_{L20}$ are chosen as a function of the impedance at the common emitters of the transistor pairs 404 and 406 and the output impedance at the collectors of the transistors $T_5$ and $T_6$ so that the nodes 414 and 416 apply the amplified RF signal voltage to the interconnection 412. The transmission line $Z_{L7}$ connected in common in series with the RF amplifier paths modifies the impedance presented by the current source $I_{tail\_2}$ so as to increase the common mode stability of the differential amplifier transistors $T_5$ and $T_6$. The length of the transmission line $Z_{L7}$ is chosen as a function of the output impedance of the current source $I_{Tail\_2}$ and of the parasitic capacitance of the current source $I_{Tail\_2}$. In the implementation referred to above for use at an input RF frequency of 77 GHz, by way of example, satisfactory values for the lengths of $Z_{L19}$ and $Z_{L20}$ were found to be 200 µm.

The transmission lines $Z_{L8}$, $Z_{L9}$, $Z_{L10}$, $Z_{L11}$ and $Z_{L17}$, $Z_{L18}$ are of length $\lambda/4$, where $\lambda$ is the wavelength of the RF signal involved, so that they present an inductive impedance to provide the bias voltages Vb_RF, Vb_LO and Vee to the RF and LO amplifier stages without attenuating the RF signal. The second harmonics at $2\omega RF$ at the common emitters in the LO stage are strongly attenuated by the $\lambda/4$ transmission lines $Z_{L8}$, $Z_{L9}$, $Z_{L10}$, $Z_{L11}$ and $Z_{L17}$, $Z_{L18}$, which are $\lambda/2$ transmission lines at $2\omega RF$ and which ground the second harmonics at $2\omega RF$ through the low impedance paths to the bias voltage sources and the supply rail.

This embodiment of the invention provides independent biases and supply voltages for the RF differential amplifier 402 and for the LO switching differential amplifiers 404 and 406. The RF and LO differential amplifiers are, from a DC point of view, independent, even when the mixer is in compression. This means that the input RF differential amplifier 402 can be optimized for low noise and high linearity and the LO switching differential amplifiers 404 and 406 can be optimized for low 1/f noise, for example.

In a variant of this example of an embodiment of the invention, the transmission lines connecting the nodes 408 and 409 to the supply rail Vcc are replaced by parallel connections of capacitor and resistor (R-C circuits). In another variant of this example of an embodiment of the invention, suitable for a broadband receiver, respective resistors are connected in series with the transmission lines between the nodes 408 and 409 and the supply rail Vcc.

Figure 5:
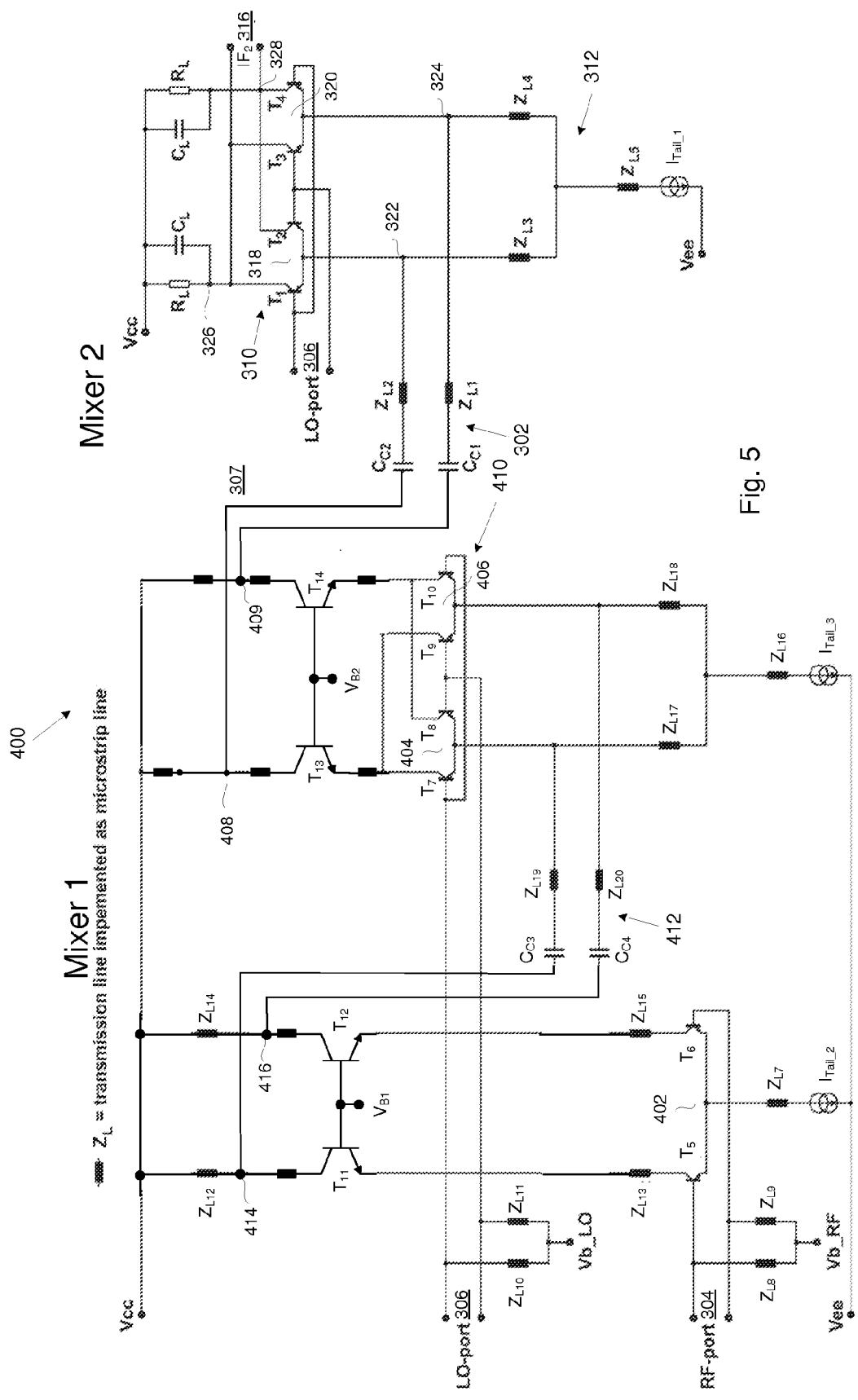
FIG. 5 is a detailed schematic diagram of another down-conversion module in accordance with an embodiment of the present invention, given by way of example.

FIG. 5 shows another example of an embodiment of the invention, in which common base differential pairs of transistors $T_{11}$ and $T_{12}$ are added with their collector-emitter paths in series in the amplifier paths of the RF amplifier 402 of the first mixer stage Mixer 1 in cascode configuration, their bases being biased to a common bias voltage $V_{B1}$. In addition, common base differential pairs of transistors $T_{13}$ and $T_{14}$ are added with their collector-emitter paths in series between the first and second voltage dividers and the cross-coupled transistors of the switched pairs 410 of the first mixer stage Mixer 1 in cascode configuration, their bases being biased to a common bias voltage $V_{B2}$. The cascode configurations of this embodiment of the invention give a greater gain than in the embodiment of FIG. 4.

Figure 6:
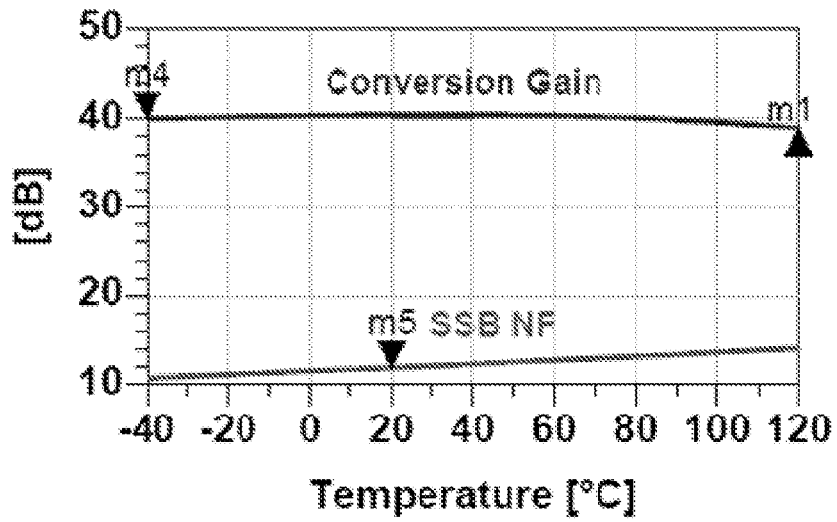
FIG. 6 is a graph of conversion gain and noise figures against temperature obtained with the module of FIG. 5.
Figure 7:
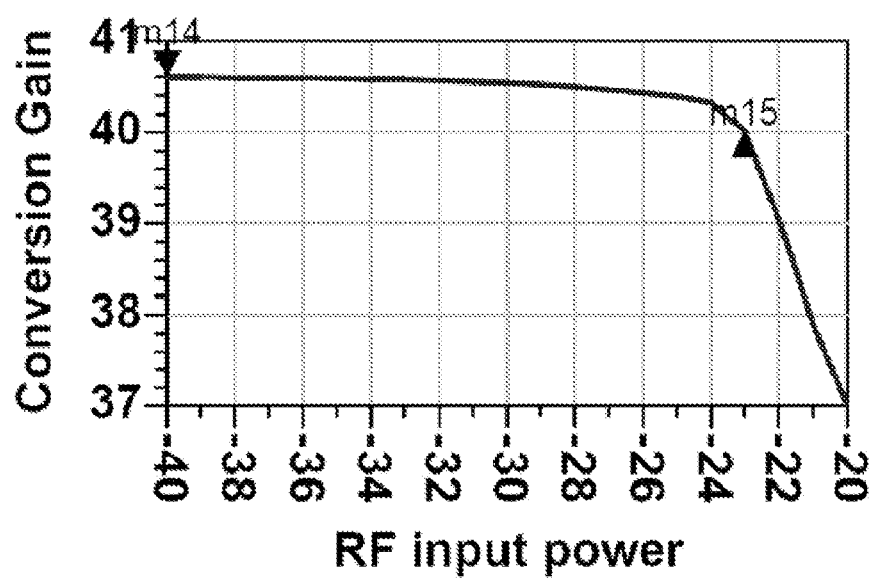
FIG. 7 is a graph of conversion gain against input power obtained with the module of FIG. 5.

In an implementation of the example shown in FIG. 4 running at 3.3 volts DC supply, the conversion gain was 25 dB and the compression point (iCP) was −9 dBm. FIG. 6 shows the conversion gain and noise figure for another implementation running at 5 volts DC supply as a function of temperature and FIG. 7 shows its conversion gain as a function of input power. The conversion gain for the example whose performance is shown in FIG. 6 was 40.5 dB and the compression point (iCP) was −22.5 dBm. It will be seen that the conversion gain and noise figure are almost constant over an operating range from −40° C. to +120° C. and in this connection the absence of low noise amplifier at the input reduces temperature sensitivity. The mixer circuit Mixer 2 can be designed with low current density through the active components, reducing 1/f noise, power consumption and temperature sensitivity.

The embodiments of the present invention described above with reference to the drawings offer high LO-to-RF isolation, while keeping the receiver response highly linear.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Where the context admits, it will be understood that the bipolar transistors of the embodiments of the invention described may replaced by field-effect transistors or other types of transistors, with suitable adaptation of the circuits described. The semiconductor materials used may be any suitable semiconductor material or combinations of materials, such as gallium arsenide, silicon germanium, silicon-on-insulator (SOI), silicon, monocrystalline silicon, the like, and combinations of the above.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal or other prioritization of such elements. The expression 'radio frequency' ('RF') is used in this specification to designate wireless communication frequencies without any specific upper limit.

The invention claimed is:

1. A down-conversion module for a heterodyne receiver comprising a first mixer circuit, a second mixer circuit and an interconnection, said first mixer circuit including first differential control terminals and second differential control terminals and being arranged to produce a first down-converted differential voltage signal at a first down-converted frequency as a function of a first RF differential input signal applied to said first differential control terminals and of a first RF differential reference frequency signal applied to said second differential control terminals, and said second mixer circuit including two differential pairs of second amplifier elements, said second amplifier elements comprising second differential control terminals and cross-connected pairs of second amplifier output paths for producing a second down-converted differential voltage signal at a second down-converted frequency as a function of said first down-converted differential voltage signal and of a second RF differential reference frequency signal applied to said second differential control terminals, wherein said interconnection includes transmission line elements and is arranged to apply a differential current signal which is a function of said first down-converted differential voltage signal to differential input terminals of said second mixer circuit common to respective pairs of said second amplifier elements.

2. A down-conversion module as claimed in claim 1, wherein said interconnection comprises a pair of interconnection paths each comprising a respective one of said interconnection transmission line elements in series with a respective capacitor element.

3. A down-conversion module as claimed in claim 1, said first mixer circuit including a differential pair of first amplifier elements for producing first differential amplified current signals as a function of said first RF differential input signal applied to said first differential input terminals, and two differential pairs of further amplifier elements comprising cross-coupled further amplifier paths for producing said first down-converted differential voltage signal as a function of said first RF differential reference frequency signal applied to said second differential control terminals and of said first differential amplified current signals applied to differential input terminals of said two differential pairs of further amplifier elements.

4. A down-conversion module as claimed in claim 3 and including a local oscillator module for producing said first and second RF differential input signals at the same local oscillator frequency for both said first and second mixer circuits.

5. A down-conversion module as claimed in claim 4, wherein said local oscillator frequency is arranged to be substantially equal to half the frequency of said first RF differential input signal, so that said second down-converted differential voltage signals are in baseband.

6. A down-conversion module as claimed in claim 3, wherein said first mixer circuit includes first biasing elements for said differential pair of first amplifier elements and second biasing elements for said two differential pairs of further amplifier elements.

7. A down-conversion module as claimed in claim 3, wherein said first mixer circuit includes a further differential pair of amplifier elements in stacked cascode configuration with said differential pair of first amplifier elements.

8. A down-conversion module as claimed in claim 3, wherein said first mixer circuit includes a further differential pair of amplifier elements in stacked cascode configuration with said two differential pairs of further amplifier elements.

9. A heterodyne receiver including a down-conversion module as claimed in claim 1.

10. A receiver as claimed in claim 9, wherein single-ended to differential conversion is obtained using a balanced-unbalanced transformer before said first mixer circuit.

* * * * *